US010079560B2

(12) United States Patent
Chen et al.

(10) Patent No.: US 10,079,560 B2
(45) Date of Patent: Sep. 18, 2018

(54) PIEZOELECTRIC ENERGY HARVESTER

(71) Applicant: NATIONAL CHENG KUNG UNIVERSITY, Tainan (TW)

(72) Inventors: Chung-De Chen, Tainan (TW); Chin-Lung Yang, Tainan (TW); Kuan-Wei Chen, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 382 days.

(21) Appl. No.: 15/084,469

(22) Filed: Mar. 29, 2016

(65) Prior Publication Data

US 2016/0294308 A1 Oct. 6, 2016

(30) Foreign Application Priority Data

Mar. 31, 2015 (TW) ............................ 104110510 A

(51) Int. Cl.
*H02N 2/18* (2006.01)
*H01L 41/113* (2006.01)

(52) U.S. Cl.
CPC ........... *H02N 2/18* (2013.01); *H01L 41/1136* (2013.01)

(58) Field of Classification Search
USPC ................ 310/339, 370, 332, 330, 348, 311
See application file for complete search history.

(56) References Cited

U.S. PATENT DOCUMENTS

| | | | | |
|---|---|---|---|---|
| 7,579,757 | B2 * | 8/2009 | Kulah | F03G 7/08 310/339 |
| 8,354,778 | B2 * | 1/2013 | Arnold | H02K 7/1892 310/370 |
| 9,612,040 | B2 * | 4/2017 | Casset | F24J 3/00 |
| 9,876,445 | B2 * | 1/2018 | Jeong | H02N 2/18 |

FOREIGN PATENT DOCUMENTS

| | | | |
|---|---|---|---|
| CN | 102594203 | A | 7/2012 |
| CN | 103023378 | A | 4/2013 |
| CN | 203219211 | U | 9/2013 |
| CN | 203288466 | U | 11/2013 |
| TW | 201214943 | A | 4/2012 |

* cited by examiner

*Primary Examiner* — Thomas Dougherty
*Assistant Examiner* — Karen B Addison
(74) *Attorney, Agent, or Firm* — CKC & Partners Co., Ltd.

(57) ABSTRACT

A piezoelectric energy harvester is provided. The piezoelectric energy harvester includes a housing, a metal plate, a first piezoelectric material, an auto-returning device, a movable supporter, a first magnet and a second magnet. The housing includes a bottom plate, a top plate, a first side wall and a second side wall. A first terminal of the metal plate is fixed on the first side wall and a second terminal of the metal plate extends toward the second side wall. The first piezoelectric material is disposed on the metal plate to be deformed when the metal plate is deformed. When the movable supporter is moved, the movable supporter can push the second terminal of the metal plate to deform the metal plate. The first magnet and the second magnet are respectively disposed on the bottom plate and the top plate to attract the second terminal of the metal plate.

12 Claims, 5 Drawing Sheets

100

110 114 MA1 140 130 124 MA3 142 116a 116b 122 120 MA4 112 MA2 150

116b
140
142
150
MA1
MA3
MA2
124
MA4
130
114
120
112
122
110
116a
100

PIEZOELECTRIC ENERGY HARVESTER

RELATED APPLICATIONS

This application claims priority to Taiwan Application Serial Number 104110510, filed Mar. 31, 2015, which is herein incorporated by reference.

BACKGROUND

Field of Invention

The present invention relates to a piezoelectric energy harvester.

Description of Related Art

A piezoelectric energy harvester is a device capable of converting vibration power to electric power. The piezoelectric energy harvester is generally used in low power consuming electric devices, such as light emitting diodes (LEDs) or wireless transmitters, to replace traditional batteries or supply rechargeable batteries. Since environmental protection criteria are getting strict, a number of electric devices using the piezoelectric energy harvesters to replace batteries are increased. However, a conventional piezoelectric energy harvester does not support multi-channel wireless transmitter, and energy provided by the conventional piezoelectric energy harvester is only about 200 micro-joules. The conventional piezoelectric energy harvester cannot steadily provide stable electric power to an electric device.

Therefore, there is a demand for a piezoelectric energy harvester to solve the above problems.

SUMMARY

One object of the present invention is to provide a piezoelectric energy harvester. The piezoelectric energy harvester not only has a smaller size, but also provides more electric power in a compact size and satisfies the demand for multi-channel switches.

According to the aforementioned object, the piezoelectric energy harvester includes a housing, a metal plate, a first piezoelectric material, an auto-returning device, a movable supporter, a first magnet and a second magnet. The housing includes a bottom plate, a top plate, a first side wall and a second side wall. The first sidewall and the second sidewall are opposite to each other and located between the bottom plate and the top plate. The metal plate is disposed between the first sidewall and the second side wall. The metal plate has a first terminal and a second terminal, the first terminal is fixed on the first sidewall, and the second terminal extends toward the second side wall. The first piezoelectric material is disposed on a first surface of the metal plate to be deformed when the metal plate is deformed. The movable supporter is disposed on the auto-returning device. The movable supporter includes a receiving part used to receive the metal plate and to push the metal plate to deform the metal plate when the movable supporter is moved. The first magnet is disposed on the bottom plate. The first magnet is used to attract the second terminal of the metal plate when the receiving part pushes the second terminal of the metal plate towards the bottom plate, thereby enabling the second terminal of the metal plate to be attached on the first magnet. The second magnet is disposed on the top plate, wherein the second magnet is used to attract the second terminal of the metal plate when the auto-returning device pushes the second terminal of the metal plate to enable the second terminal of the metal plate to be pushed towards the top plate by the receiving part, thereby enabling the second terminal of the metal plate to be attached on the second magnet.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
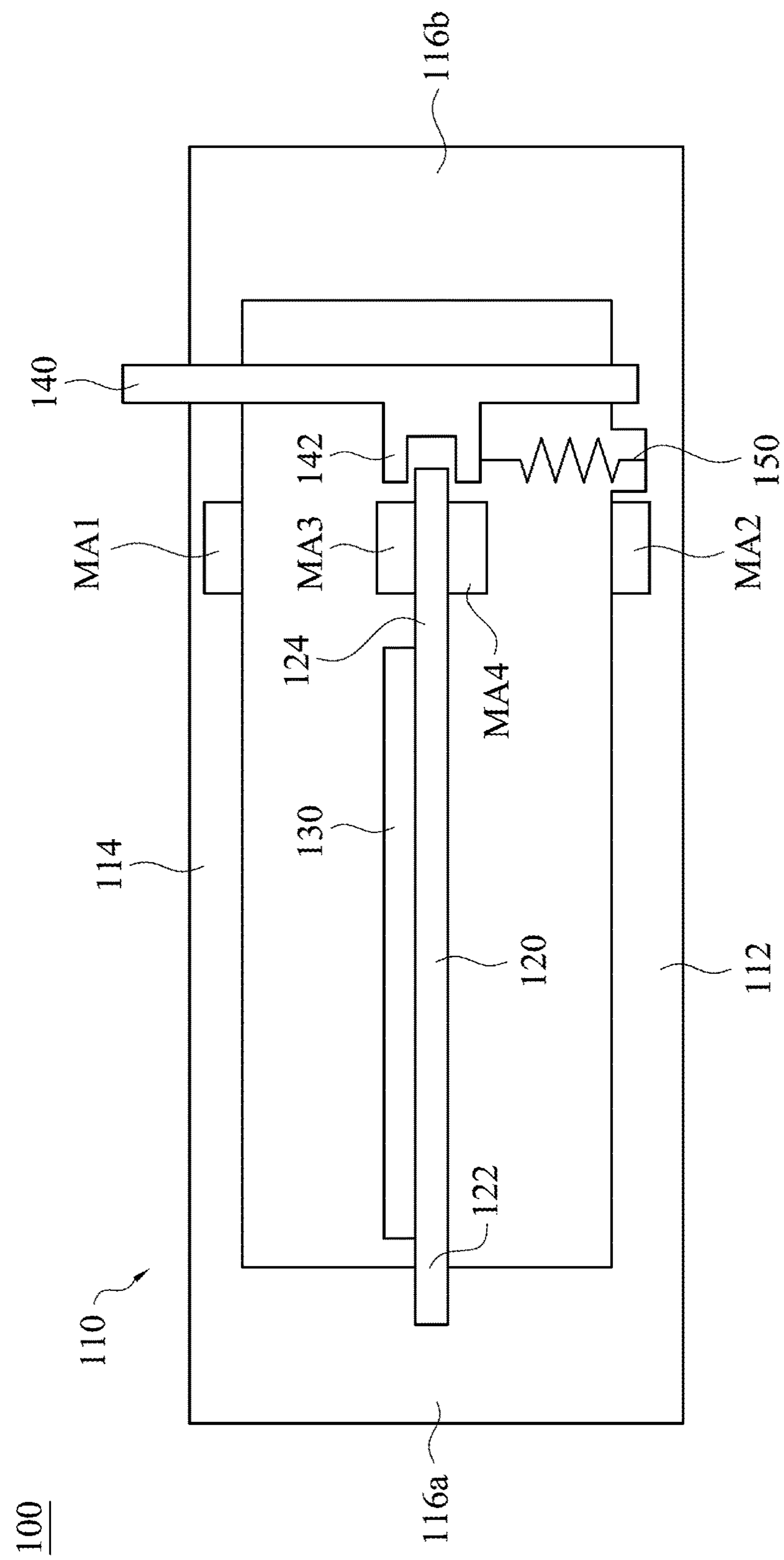
FIG. 1 is a cross-sectional view of a piezoelectric energy harvester in accordance with an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Embodiments of the present invention are disclosed below by drawings. For purpose of clarity, some details in practice will be described together with the following description. However, it should be understood that, these details in practice are not intended to limit the present invention. In other words, in some embodiments of the present invention, these details in practice are not necessary. In addition, for purpose of simplifying the drawings, some conventional structures and components in the drawings will be illustrated in a schematic way.

Referring to FIG. 1, FIG. 1 is a cross-sectional view of a piezoelectric energy harvester 100 in accordance with an embodiment of the present invention. The piezoelectric energy harvester 100 includes a housing 110, a metal plate 120, a first piezoelectric material 130, a movable supporter 140, an auto-returning device 150, a first magnet MA1, a second magnet MA2, a third magnet MA3 and a fourth magnet MA4. In this embodiment of the present invention, the piezoelectric energy harvester 100 includes an energy storage module (not shown) used to store electric power generated by the first piezoelectric material 130 and to provide the electric power to an external electric device, for example, a wireless transmitter. The housing 110 includes a bottom plate 112, a top plate 114, a first sidewall **116*a* and a second sidewall 116*b*, in which the first sidewall 116*a* is opposite to the second sidewall 116*b*, and the bottom plate 112 is opposite to the top plate 114**.

The metal plate 120 includes a first terminal 122 and a second terminal 124. The first terminal 122 is fixed on the first sidewall **116*a*, and the second terminal 124 extends toward the second side wall 116*b*. The first piezoelectric material 130 is disposed between the first terminal 122 and the second terminal 124. The first piezoelectric material 130 is disposed on the metal plate 120 to be deformed when the metal plate 120 is deformed, thereby generating electric power to be outputted. The first piezoelectric material 130** may be, for example, lead zirconium titanate (PZT), aluminium nitride, lithium niobate or zinc oxide, but the embodiments of the present invention are not limited thereto.

The movable supporter 140 is used to be pressed by a user to enable the piezoelectric energy harvester 100 to generate electric power. In this embodiment of the present invention, the movable supporter 140 includes a receiving part 142 used to receive a portion of the metal plate 120, thereby pushing the metal plate 120 upward or downward when the movable supporter 140 is moved upward or downward. Since first terminal 122 is fixed on the first sidewall 116*a*, the upward-moving motion and the downward-moving motion of the metal plate 120 enable the metal plate 120 to be deformed (bent), thereby enabling the first piezoelectric material 130 disposed on the metal plate 120 to be deformed and generate electric power consequently.

In this embodiment, the receiving part 142 receives the second terminal 124 of the metal plate 120, thereby pushing the second terminal 124 upward or downward, but the embodiments of the present invention art not limited thereto. For example, in another embodiment, the receiving part 142 receives a plate potion on which the first piezoelectric material 130 is disposed, thereby pushing the plate portion upward or downward.

In this embodiment, the receiving part 142 is a U-type part, and an opening of the U-type part receives the second terminal 124 of the metal plate 120. Each of the upper surface and the lower surface of the second terminal 124 has a pressing region (not labelled) configured to be touched by the receiving part 142. When the movable supporter 140 is moved, the receiving part 142 touches the pressing region of the terminal 124 to push the terminal 124 of the metal plate 120 upward or downward.

The auto-returning device 150 is disposed adjacent to the movable supporter 140 to provide an auto-returning mechanism to the movable supporter 140. In this embodiment, the auto-returning device 150 is a spring disposed between the movable supporter 140 and the bottom pale 112, but the embodiments of the present invention are not limited thereto. For example, in other embodiments of the present invention, the auto-returning device 150 is disposed between the movable supporter 140 and the top plate 114.

The first magnet MA1 and the second magnet MA2 are respectively disposed on the top plate 114 and the bottom plate 112 of the housing 110, and the third magnet MA3 and the fourth magnet MA4 are respectively disposed on opposite surfaces of the metal plate 120. In this embodiment, the third magnet MA3 and the fourth magnet MA4 are located on the second terminal 124, and the first magnet MA1 and the second magnet MA2 are respectively disposed above/under the third magnet MA3 and the fourth magnet MA4 accordingly, to help the operation of the piezoelectric energy harvester 100.

Figure 2A:
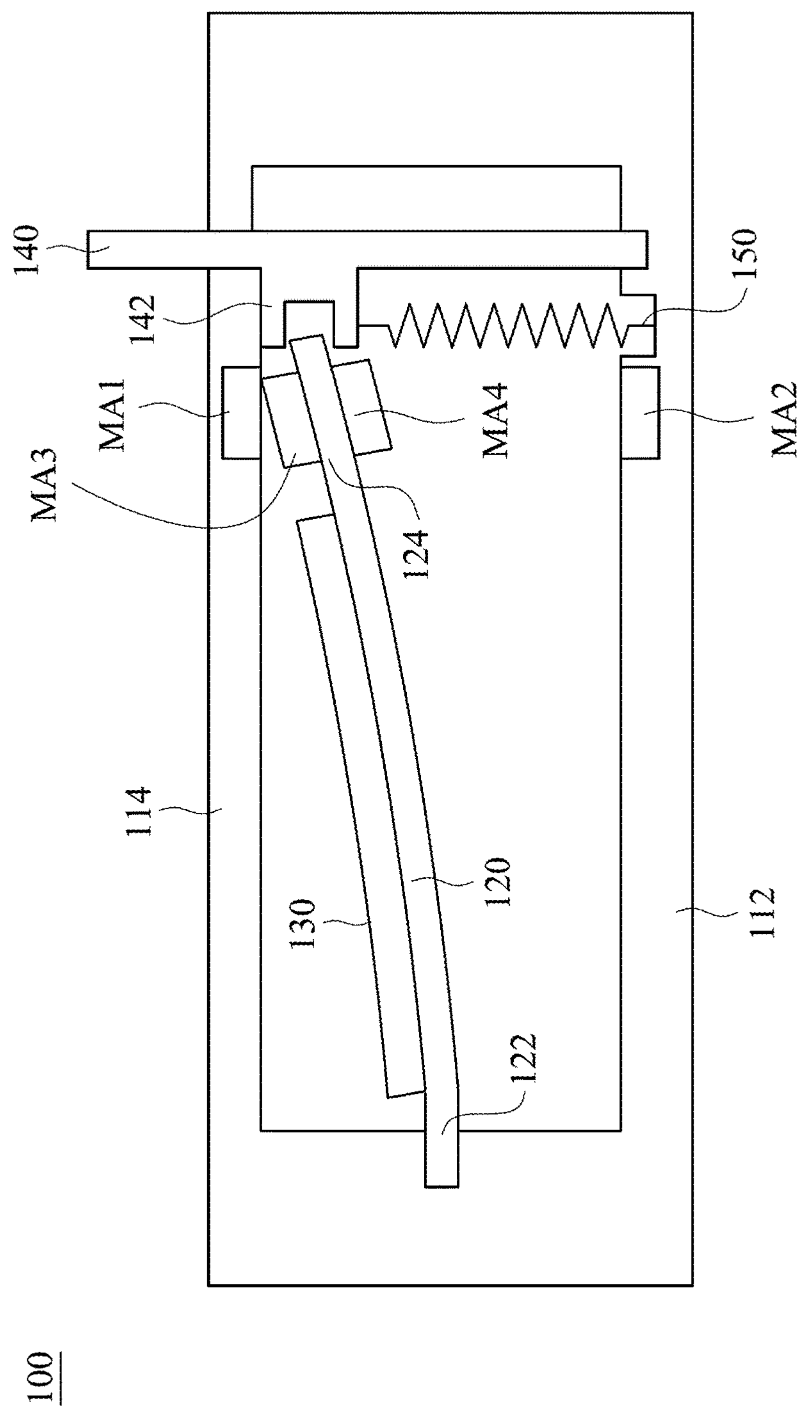
FIG. 2A to FIG. 2C are schematic diagrams showing an operation of power generation of the piezoelectric energy harvester in accordance with an embodiment of the present invention.
Figure 2B:
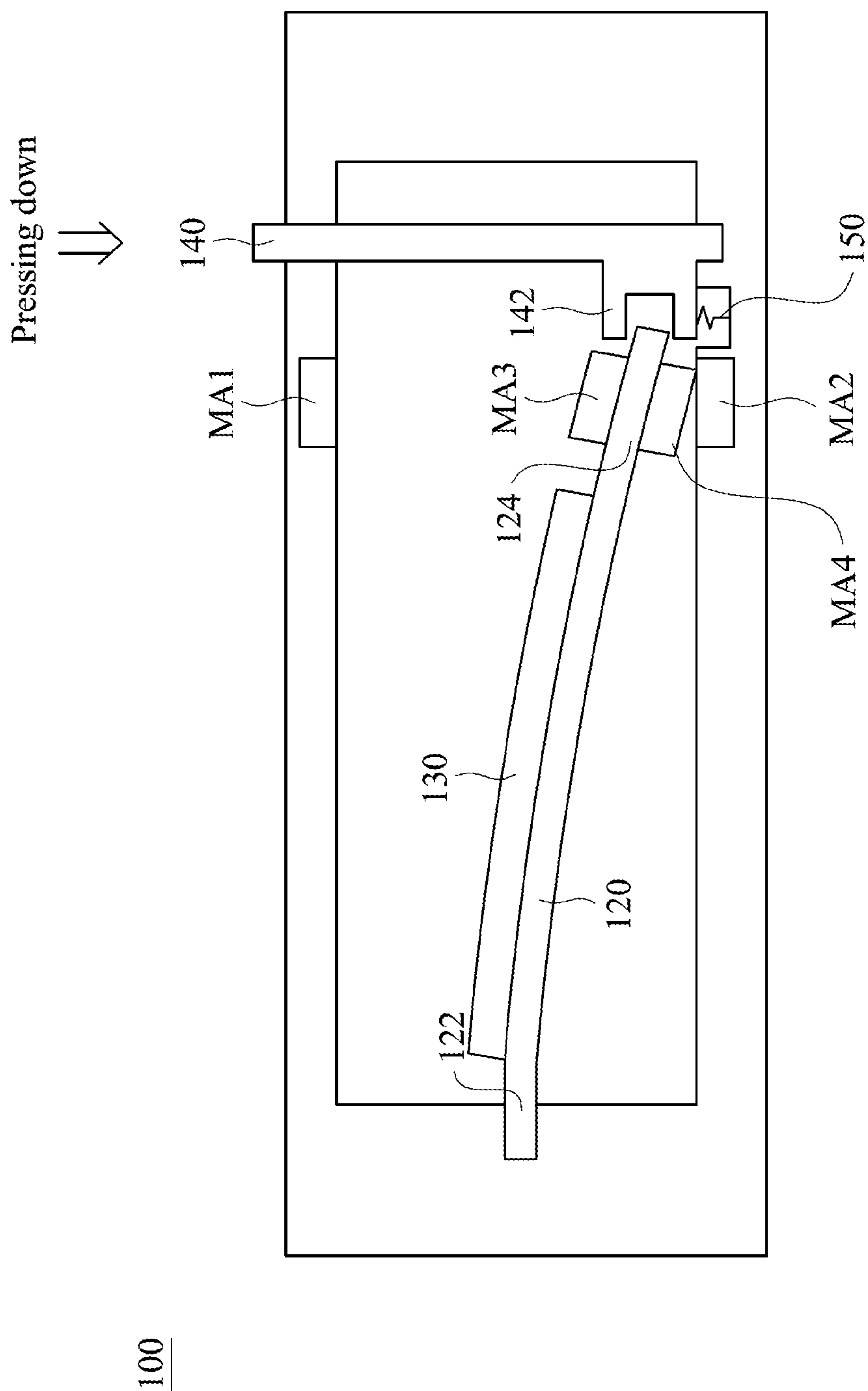
Figure 2C:
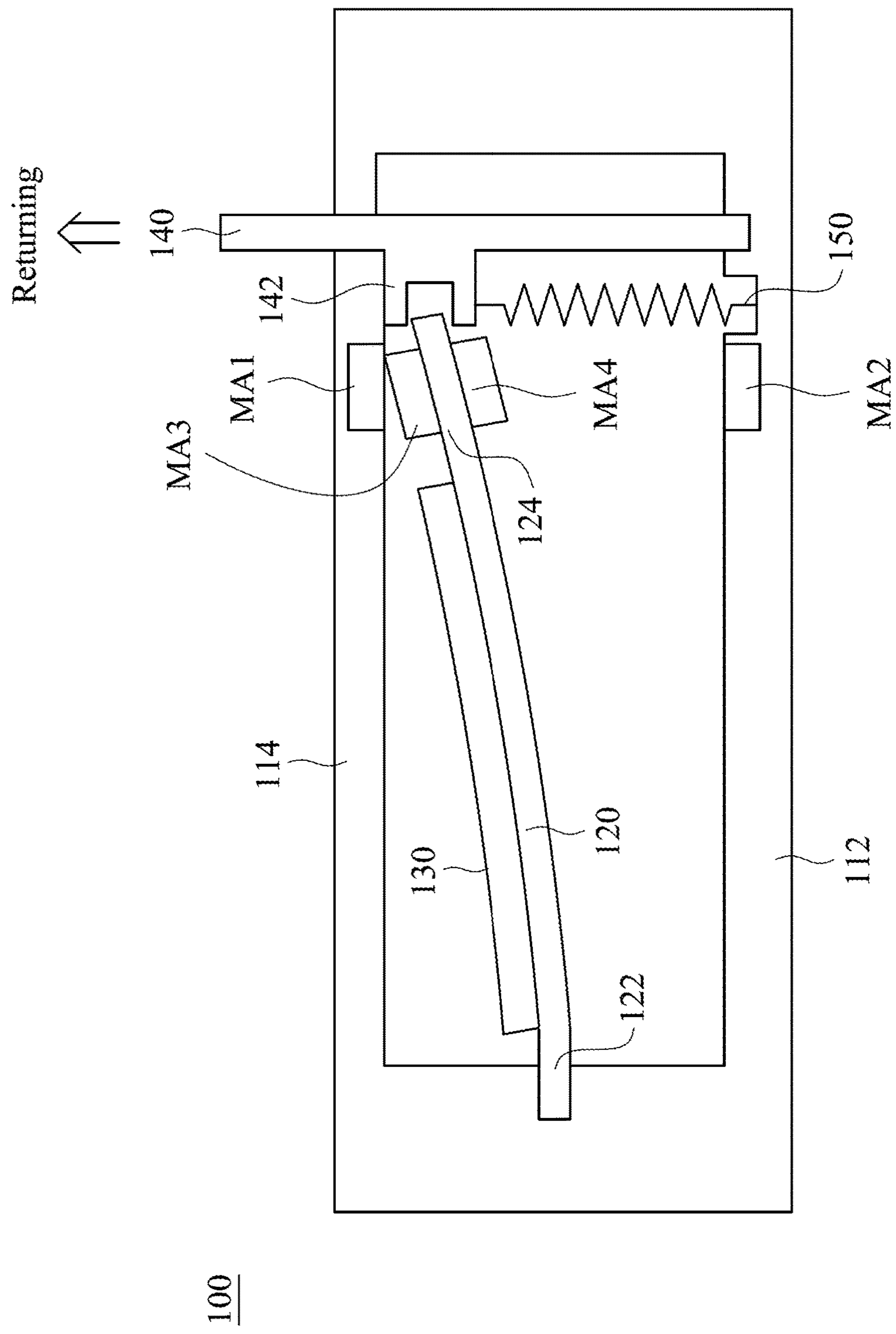

Referring to FIG. 2A to FIG. 2C simultaneously, FIG. 2A to FIG. 2C are schematic diagrams showing an operation of power generation of the piezoelectric energy harvester 100 in accordance with an embodiment of the present invention. An initial state of the piezoelectric energy harvester 100 is shown in FIG. 2A, in which the second terminal 124 of the metal plate 120 of the piezoelectric energy harvester 100 is attached on the first magnet MA1 through the third magnet MA3.

Thereafter, when the user presses the movable supporter 140 to move the movable supporter 140 downward, the receiving part 142 of the movable supporter 140 pushes the second terminal 124 of the metal plate 120 to move the second terminal 124 of the metal plate 120 downward, and thus the metal plate 120 is bent downward. When the second terminal 124 of the metal plate 120 approaches the second magnet MA2, the fourth magnet MA4 on the second terminal 124 is attracted by the second magnet MA2, and thus the second terminal 124 is moved more quickly towards the bottom plate 112. Consequently, the second terminal 124 of the metal plate 120 is attached on the second magnet MA2 through the fourth magnet MA4, as shown in FIG. 2B. In addition, during the user presses the movable supporter 140, the auto-returning device 150 stores energy for the purpose of returning-back of the movable supporter 140.

Then, when the user releases the movable supporter 140, the auto-returning device 150 pushes the movable supporter 140 upward to move the second terminal 124 of the metal plate 120 upward, and thus the metal plate 120 is bent upward. When the second terminal 124 of the metal plate 120 approaches the first magnet MA1, the third magnet MA3 on the second terminal 124 is attracted by the first magnet MA1, and thus the second terminal 124 is moved more quickly towards the top plate 114. Consequently, the second terminal 124 of the metal plate 120 is attached on the first magnet MA1 through the third magnet MA3, and the piezoelectric energy harvester 100 returns to the initial state as shown in FIG. 2C.

It can be understood form the above descriptions that in the piezoelectric energy harvester 100 of the embodiment of the present invention, the metal plate 120 is bent upward one time and downward one time when the user presses the movable supporter 140 one time, and the first piezoelectric material 130 is bent upward one time and downward one time accordingly to generate electric power. Further, the piezoelectric energy harvester 100 of the embodiment of the present invention enables the deformation of the metal plate 120 to be quicker through the arrangement of the first magnet MA1 and the second magnet MA 2, thereby magnifying a strain rate of the first piezoelectric material 130. Therefore, great electric power is generated by the first piezoelectric material 130. Moreover, the piezoelectric energy harvester 100 of the embodiment of the present invention deforms the metal plate 120 through touching the pressing regions of the metal plate 120 to implement the deformation of the first piezoelectric material 130, and therefore force cannot be directly applied on the first piezoelectric material 130 to avoid deterioration of the first piezoelectric material 130, and thus the life of the piezoelectric energy harvester 100 is increased significantly. In addition, when a magnet (for example magnet MA2) is hit by another magnet (for example magnet MA4), impact energy is generated to enable a vibration of the metal plate 120 and the first piezoelectric material 130 and the vibration of the first piezoelectric material 130 enables the first piezoelectric material 130 to generate more electric power. The use of the magnets MA1-MA4 increases the impact energy for the vibration of the metal plate 120. Comparing with a conventional piezoelectric energy harvester, the piezoelectric energy harvester 100 of the embodiment of the present invention has a size of one-fourth to half of that of the conventional piezoelectric energy harvester, and provides electric power 1.5 to 2 times of that of the conventional piezoelectric energy harvester, and a pressing force required for the piezoelectric energy harvester 100 is lower than 10 newton which is lower than a common pressing force of human (15 newton). In addition, it is very easy to integrate the piezoelectric energy harvester of the embodiment of the present invention with other objects for commercialization and mass production, since the structure thereof is designed simply.

It is noted that the third magnet MA3 and the fourth magnet MA4 not only provide attachment functions, but also help adjustment of a resonant frequency of the first piezoelectric material 130 through the design of mass of the third magnet MA3 and the fourth magnet MA4. In this embodiment of the present invention, the third magnet MA3 and the fourth magnet MA4 can be replaced with materials having magnetism (for example, metal materials having ferromagnetism) to achieve purposes of adjustment of the resonant frequency and attachment of the metal plate. In another embodiment of the present invention, additional masses for adjustment of the resonant frequency are not used. For example, the metal plate 120 can be made by ferromagnetic materials, and therefore the second terminal 124 of the metal plate 120 can be directly attached on the first magnet MA1 and the second magnet MA2. In further another embodiment, an additional mass can be disposed on any position of the metal plate 120 for adjustment of the resonant frequency.

Figure 3:
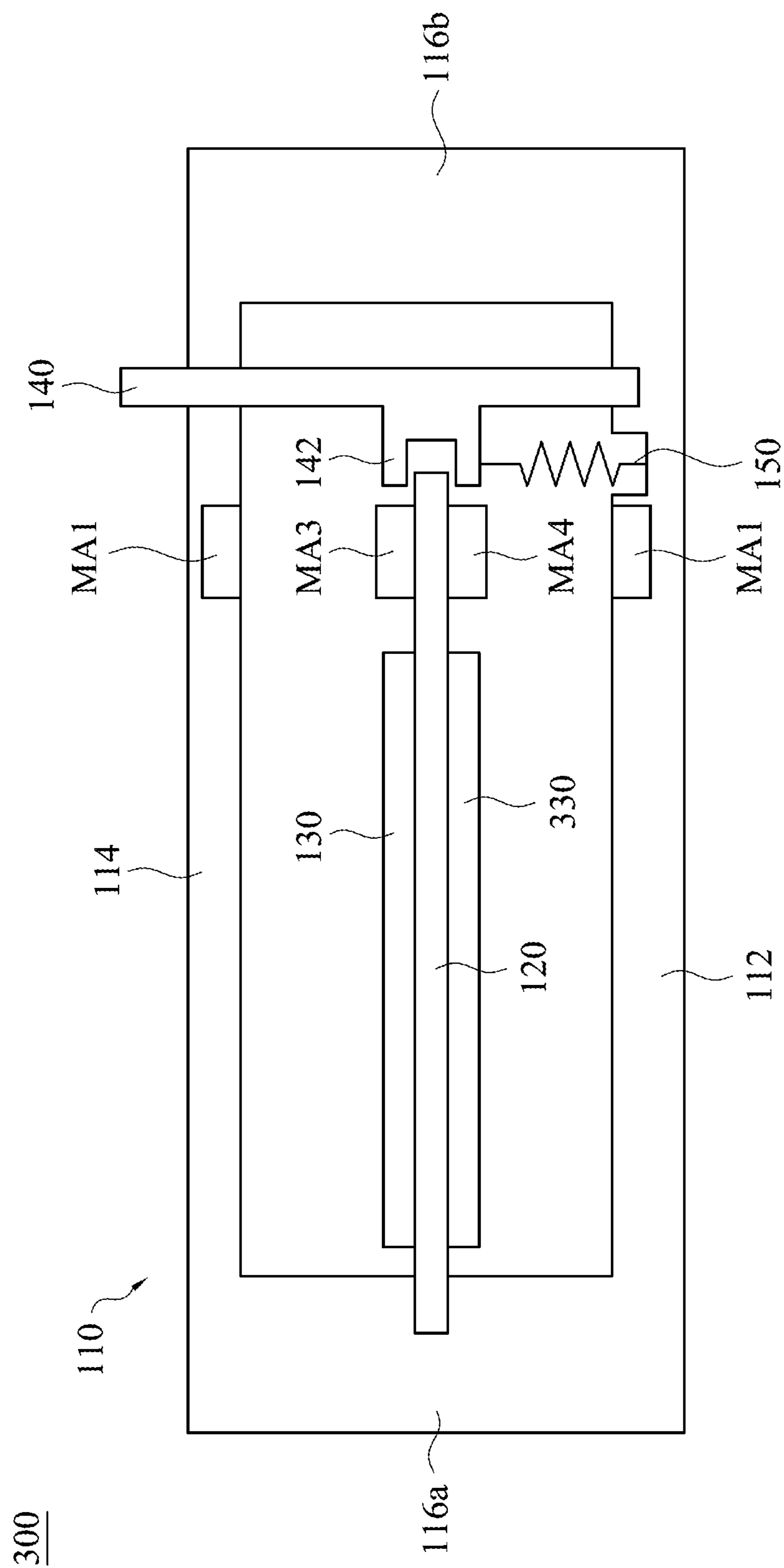
FIG. 3 is a cross-sectional view of a piezoelectric energy harvester in accordance with an embodiment of the present invention.

Referring to FIG. 3, FIG. 3 is a cross-sectional view of a piezoelectric energy harvester 300 in accordance with an embodiment of the present invention. The piezoelectric energy harvester 300 is similar to the piezoelectric energy harvester 100, but the difference is in that the piezoelectric energy harvester 300 further includes a second piezoelectric material 330. The second piezoelectric material 330 and the first piezoelectric material 130 are disposed on opposite surfaces of the metal plate 120, and thus the second piezoelectric material 330 and the first piezoelectric material 130 are deformed when the metal plate 120 is deformed, thereby providing more electric power than the piezoelectric energy harvester 100.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A piezoelectric energy harvester, comprising:

a housing comprising a bottom plate, a top plate, a first sidewall and a second side wall, wherein the first sidewall and the second sidewall are opposite to each other and located between the bottom plate and the top plate;

a metal plate disposed between the first sidewall and the second side wall, wherein the metal plate has a first terminal and a second terminal, the first terminal is fixed on the first sidewall, and the second terminal extends toward the second side wall;

a first piezoelectric material disposed on a first surface of the metal plate to be deformed when the metal plate is deformed;

an auto-returning device;

a movable supporter disposed on the auto-returning device, wherein the movable supporter includes a receiving part used to receive the metal plate and to push the metal plate to deform the metal plate when the movable supporter is moved;

a first magnet disposed on the bottom plate, wherein the first magnet is used to attract the second terminal of the metal plate when the receiving part pushes the second terminal of the metal plate towards the bottom plate, thereby enabling the second terminal of the metal plate to be attached on the first magnet; and a second magnet disposed on the top plate, wherein the second magnet is used to attract the second terminal of the metal plate when the auto-returning device pushes the second terminal of the metal plate to enable the second terminal of the metal plate to be pushed towards the top plate by the receiving part, thereby enabling the second terminal of the metal plate to be attached on the second magnet.

2. The piezoelectric energy harvester of claim 1, wherein the receiving part of the movable supporter has a U-type receiving space for receiving the second terminal of the metal plate.

3. The piezoelectric energy harvester of claim 1, wherein the receiving part is used to receive the second terminal of the metal plate and to push the second terminal of the metal plate to deform the metal plate when the movable supporter is moved.

4. The piezoelectric energy harvester of claim 3, wherein the first surface of the metal plate has a first pressing region configured to be touched by the receiving part of the movable supporter for pushing the second terminal of the metal plate, and the first piezoelectric material is disposed outside the first pressing region.

5. The piezoelectric energy harvester of claim 1, further comprising a second piezoelectric material disposed on a second surface of the metal plate to be deformed when the metal plate is deformed, wherein the second surface is opposite to the first surface.

6. The piezoelectric energy harvester of claim 5, wherein the second surface of the metal plate has a second pressing region configured to be touched by the receiving part of the movable supporter for pushing the second terminal of the metal plate, and the second piezoelectric material is disposed outside the second pressing region.

7. The piezoelectric energy harvester of claim 1, further comprising a third magnet fixed on the first surface of the metal plate and opposite to the first magnet to enable the second terminal of the metal plate to be attached on the first magnet through the third magnet, when the receiving part pushes the second terminal of the metal plate towards the bottom plate.

8. The piezoelectric energy harvester of claim 7, further comprising a fourth magnet fixed on the second surface of the metal plate and opposite to the second magnet to enable the second terminal of the metal plate to be attached on the second magnet through the fourth magnet, when the receiving part pushes the second terminal of the metal plate towards the top plate.

9. The piezoelectric energy harvester of claim 1, wherein the auto-returning device is a resilience element disposed on the bottom plate.

10. The piezoelectric energy harvester of claim 1, further comprises a mass disposed on the metal plate.

11. The piezoelectric energy harvester of claim 10, wherein the mass is disposed on the first surface of the metal plate and disposed adjacent to the second terminal of the metal plate to adjust a resonant frequency of the first piezoelectric material.

12. The piezoelectric energy harvester of claim 10, wherein the mass is a magnet.

* * * * *